United States Patent [19]

Ahles et al.

[11] Patent Number: 5,683,261

[45] Date of Patent: Nov. 4, 1997

[54] REMOVABLE COUPLING MODULE FOR MECHANICALLY MULTIPLEXING CONDUCTORS

[75] Inventors: Jerome C. Ahles, Hartland; John D. Neal, Owatonna; Randee L. Kyrola, Independence, all of Minn.

[73] Assignee: SPX Corporation, Muskegon, Mich.

[21] Appl. No.: 246,005

[22] Filed: May 19, 1994

[51] Int. Cl.⁶ .................................................. H01R 29/00
[52] U.S. Cl. ............................................................ 439/189
[58] Field of Search ................................. 439/189, 638, 439/502, 491; 324/402

[56] References Cited

U.S. PATENT DOCUMENTS

| | | | |
|---|---|---|---|
| 4,090,766 | 5/1978 | Buhr et la. | 439/491 OR |
| 4,420,794 | 12/1983 | Anderson | 439/502 X |
| 4,690,475 | 9/1987 | McElroy | 439/502 X |
| 4,862,371 | 8/1989 | Maekawa | 364/431.11 |
| 5,003,477 | 3/1991 | Abe et al. | 364/424.03 |
| 5,007,888 | 4/1991 | Goutiere | 439/189 |
| 5,040,990 | 8/1991 | Suman et al. | 439/34 |
| 5,130,893 | 7/1992 | Straate et al. | 361/392 |
| 5,214,582 | 5/1993 | Gray | 364/424.03 |
| 5,315,252 | 5/1994 | Puetz et al. | 324/402 OR |
| 5,442,170 | 8/1995 | Kreft et al. | 250/229 |

FOREIGN PATENT DOCUMENTS

| | | | |
|---|---|---|---|
| 1134884 | 5/1989 | Japan | 439/189 OR |
| WO 89/06839 | 7/1989 | WIPO | G06F 11/32 |

*Primary Examiner*—Gary F. Paumen
*Attorney, Agent, or Firm*—Kinney & Lange, P.A.

[57] ABSTRACT

A mechanical multiplexer includes a receptacle and a removable coupling module. The receptacle includes a first and second set of receptacle contacts. The removable coupling module has a body and a first and second set of module contacts extending below the body and arranged to make electrical contact with the first and second sets of receptacle contacts, respectively, when the coupling module is inserted into the receptacle. The contacts of the first set of module contacts are electrically connected to eider the contacts of the second set of module contacts or other contacts of the first set of module contacts in a selected connection pattern.

16 Claims, 7 Drawing Sheets

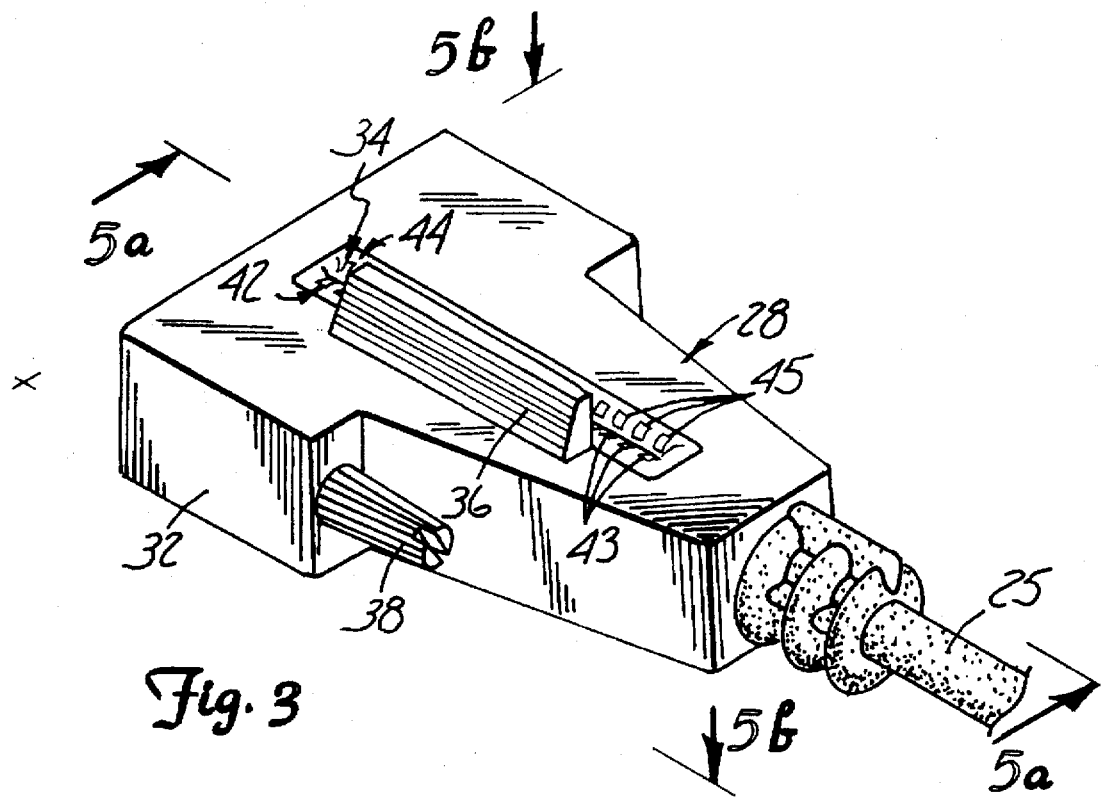
Fig. 3
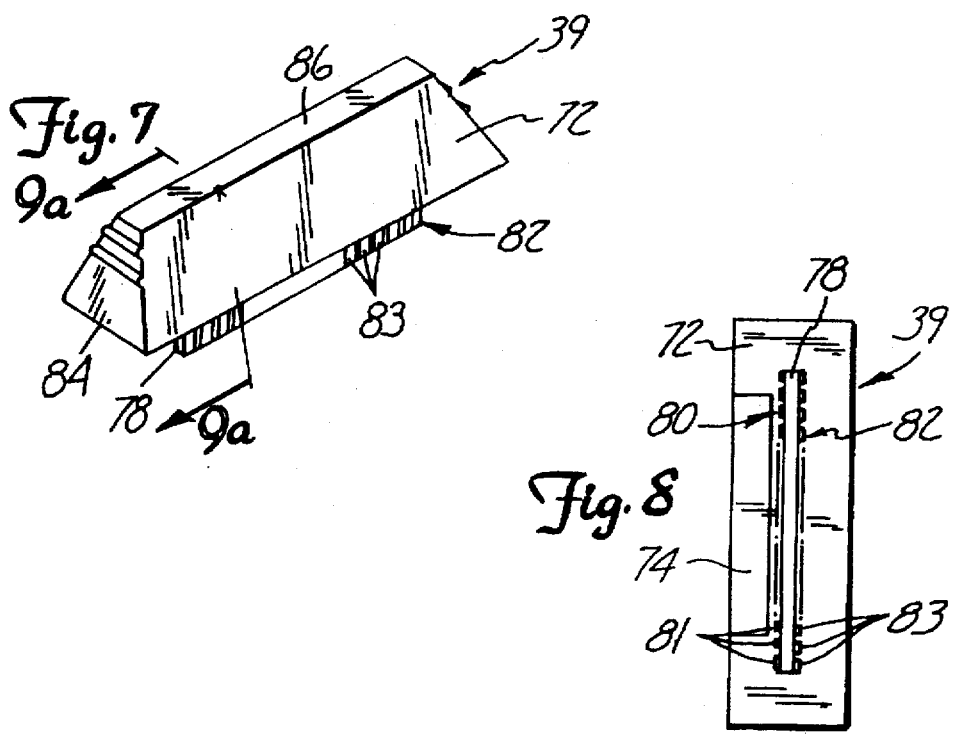
Fig. 7
Fig. 8

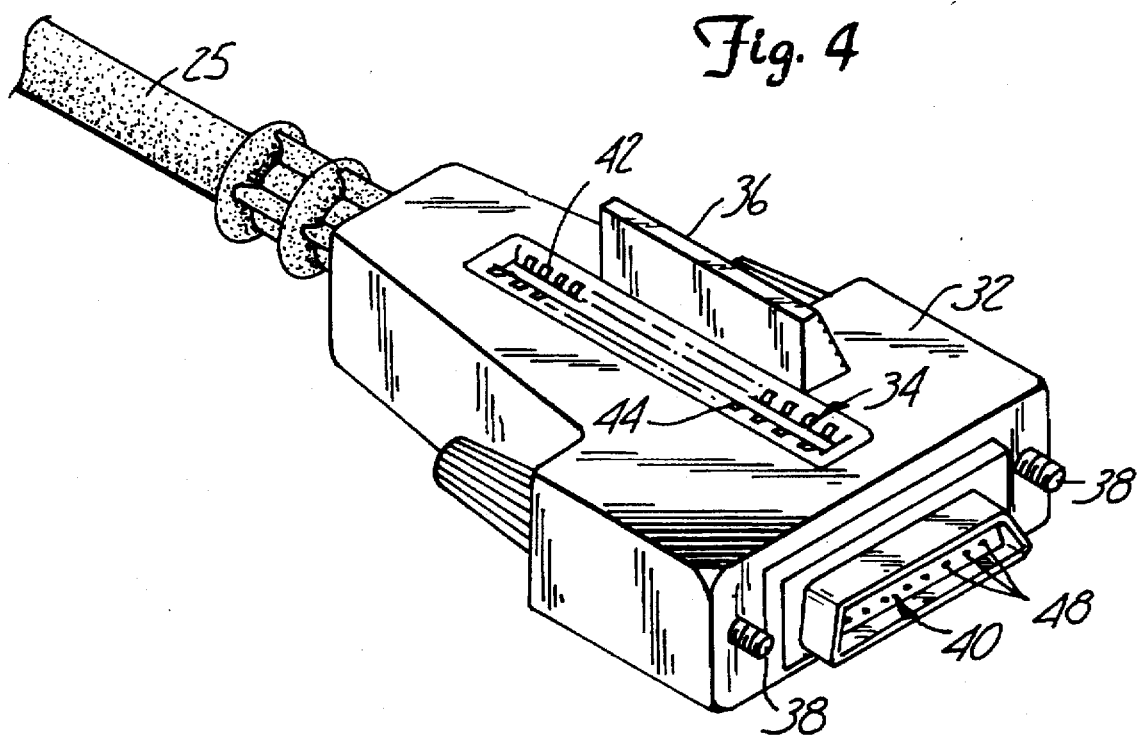

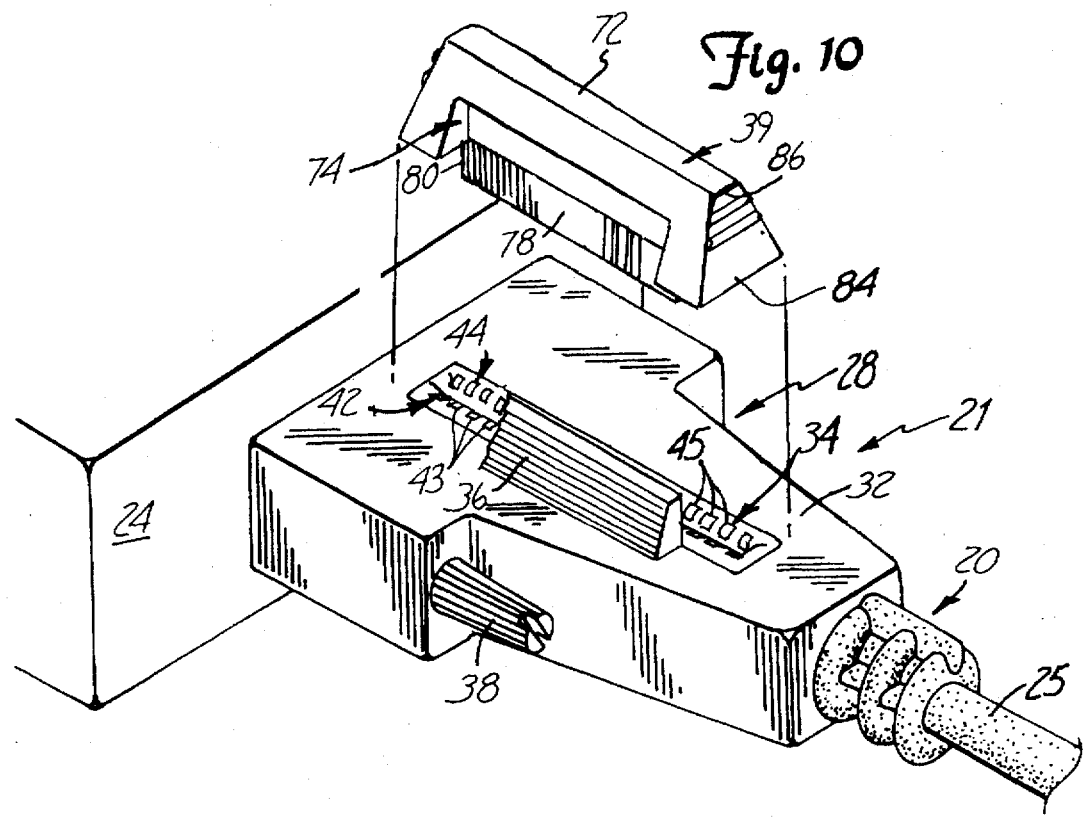
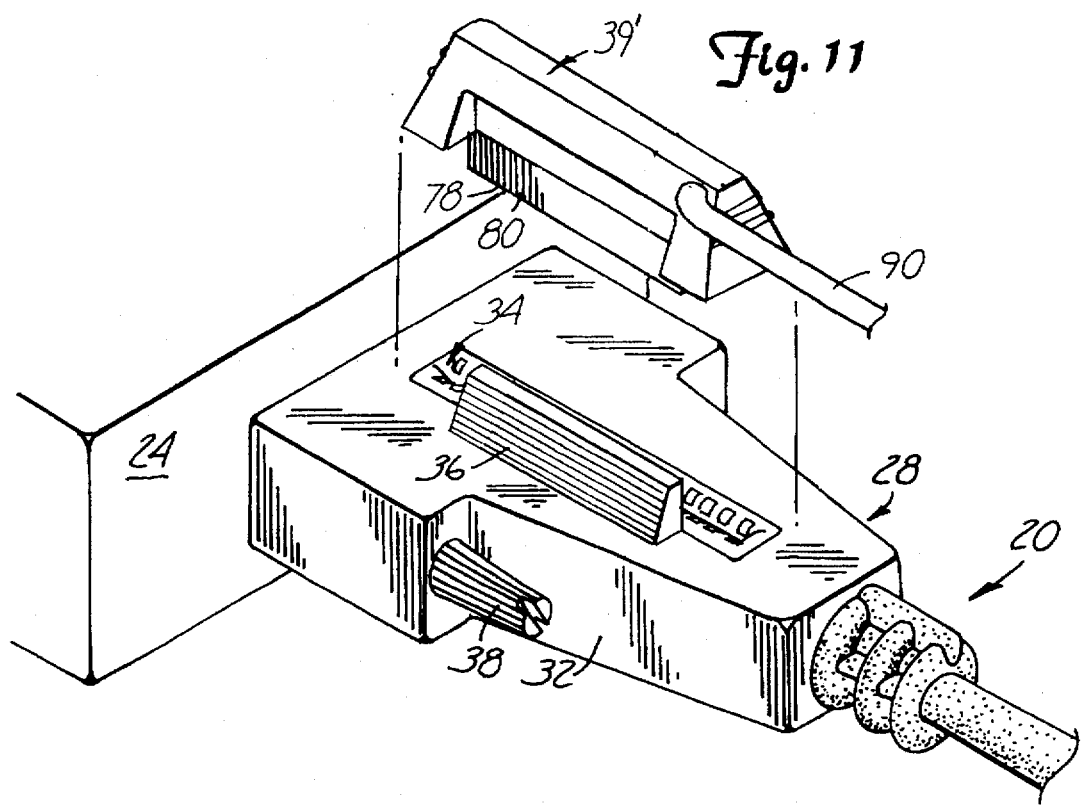

REMOVABLE COUPLING MODULE FOR MECHANICALLY MULTIPLEXING CONDUCTORS

BACKGROUND OF THE INVENTION

The present invention relates to a mechanical multiplexer for mechanically coupling electric conductors. More specifically, the present invention relates to a removable coupling module for mechanically multiplexing at least one of a first number of conductors to at least one of a second number of conductors in any desired order for vehicle testing.

Most new cars and trucks are far more sophisticated than their predecessors. A typical vehicle manufactured today, such as an automobile, includes an on-board computer to control various aspects of the vehicle's engine. The on-board computer is generally referred to as an electronic control module (ECM). Service tools to diagnose problems with vehicle engines have been developed to aid service technicians in repairing vehicles having an ECM. Many vehicles include a direct access to the electronically controlled engine parameters so that service tools may be used to facilitate a more complete diagnosis than that provided by the ECM alone. For example, in many vehicle models, a data connection liner is installed under the dash board of the vehicle in the passenger compartment. A second generation of diagnostic links with a specified connector was introduced in 1994 called the on-board diagnostic plug (OBD II).

The OBD II plug allows an off-board computer or diagnostic service tool to communicate with one or more on-board ECMs. The OBD II plug is connected to a serial port of the ECM to permit the transmission of monitored parameter data through the OBD II plug upon receiving an appropriate data enable signal from the off-board computer or service tool at the OBD II plug. The off-board computer attaches to the OBD II plug through a connector assembly comprising a multiconductor cable extending between a vehicle-side connector and a tool-side connector. The vehicle-side connector attaches to the vehicle's OBD II plug and the tool-side connector attaches to the diagnostic service tool.

The Society of Automotive Engineers (SAE) will require that all vehicles come equipped with an OBD II plug starting in 1996, and some vehicles currently come equipped with them. SAE's draft of Recommended Practice regarding an SAE J1962 Diagnostic Connector (OBD II equivalent) dated Mar. 3, 1994, gives specific details pertaining to the placement of the plug, the size and shape of the plug, which pins of the plug are designated for specific components and which pins are left to the discretion of the vehicle manufacturer.

There is currently a substantial problem in analyzing a variety of different vehicles. The pin configuration for the OBD II plug is not standard for all vehicles. For example, in the SAE requirements, pins 1, 3, 6, 8, 9, 11, 12, 13, and 14 of the 16-pin OBD II plug are left to the vehicle manufacturer's discretion. Thus, service technicians are required to have separate connector assemblies for each model vehicle they service. This drastically increases the cost of the required tools a service technician must have.

One attempt at solving this problem is disclosed in international publication WO 89/06839. This publication discloses a vehicle-specific adapter which fits between a vehicle-side connector and an OBD II plug of a vehicle. The adapter permits a single connector assembly to be used for a multitude of OBD II pin configurations. A drawback to this system is that it is a costly fix for the problem. Each of the adapters contains a housing, two connectors, and numerous pins, with each of these items adding cost.

SUMMARY OF THE INVENTION

The present invention provides a mechanical multiplexer for mechanically coupling at least one of a first number of conductors to at least one of a second number of conductors in any desired order without adding an additional housing, an additional pair of connectors and additional pins. The mechanical multiplexer includes a receptacle and a removable coupling module. The receptacle includes first and second sets of receptacle contacts. The removable coupling module is insertable into the receptacle and includes first and second sets of module contacts which extend below the body and are arranged to make electrical contact with the first and second sets of receptacle contacts, respectively. The contacts of the first set of module contacts are electrically connected to either the contacts of the second set of module contacts or other contacts of the first set of module contacts in a selected connection pattern.

In one embodiment, the mechanical multiplexer can be formed within a connector assembly extending between a vehicle diagnostic link and a diagnostic service tool to adapt the service tool for a specific vehicle. The connector assembly has a vehicle-side connector, a tool-side connector, and a multiconductor cable having a plurality of conductors extending between the vehicle-side connector and the tool-side connector. The mechanical multiplexer is preferably formed within the tool-side connector such that the tool-side connector and the vehicle-side connector are electrically coupled to the first and second set of receptacle contacts in a selected connection pattern.

When the removable coupling module is inserted into the receptacle, the tool-side connector becomes electrically coupled to the vehicle-side connector in a selected connection pattern. Thus, a service technician need only purchase a single connector assembly having the receptacle of the present invention, along with multiple inexpensive coupling modules configured for each type of vehicle to be serviced. The coupling modules are much less expensive than purchasing a separate connector assembly for each vehicle to be serviced and less expensive than purchasing adapters having a separate housing, an additional pair of connectors and numerous additional pins.

BRIEF DESCRIPTION OF THE DRAWINGS

FIG. 3 is perspective view of a tool-side connector, according to the present invention.

FIG. 4 is a perspective view of the tool-side connector of FIG. 3, as seen from the opposite side.

FIG. 7 is a perspective view of the coupling module of FIG. 6, as seen from the opposite side.

FIG. 8 is a bottom view of the coupling module of FIG. 6.

FIG. 10 is an exploded perspective view of a tool-side connector and a coupling module, according to the present invention.

FIG. 11 is an alternative embodiment of a coupling module having a power source connected to the coupling module, according to the present invention.

DETAILED DESCRIPTION OF THE PREFERRED EMBODIMENTS

Figure 1:
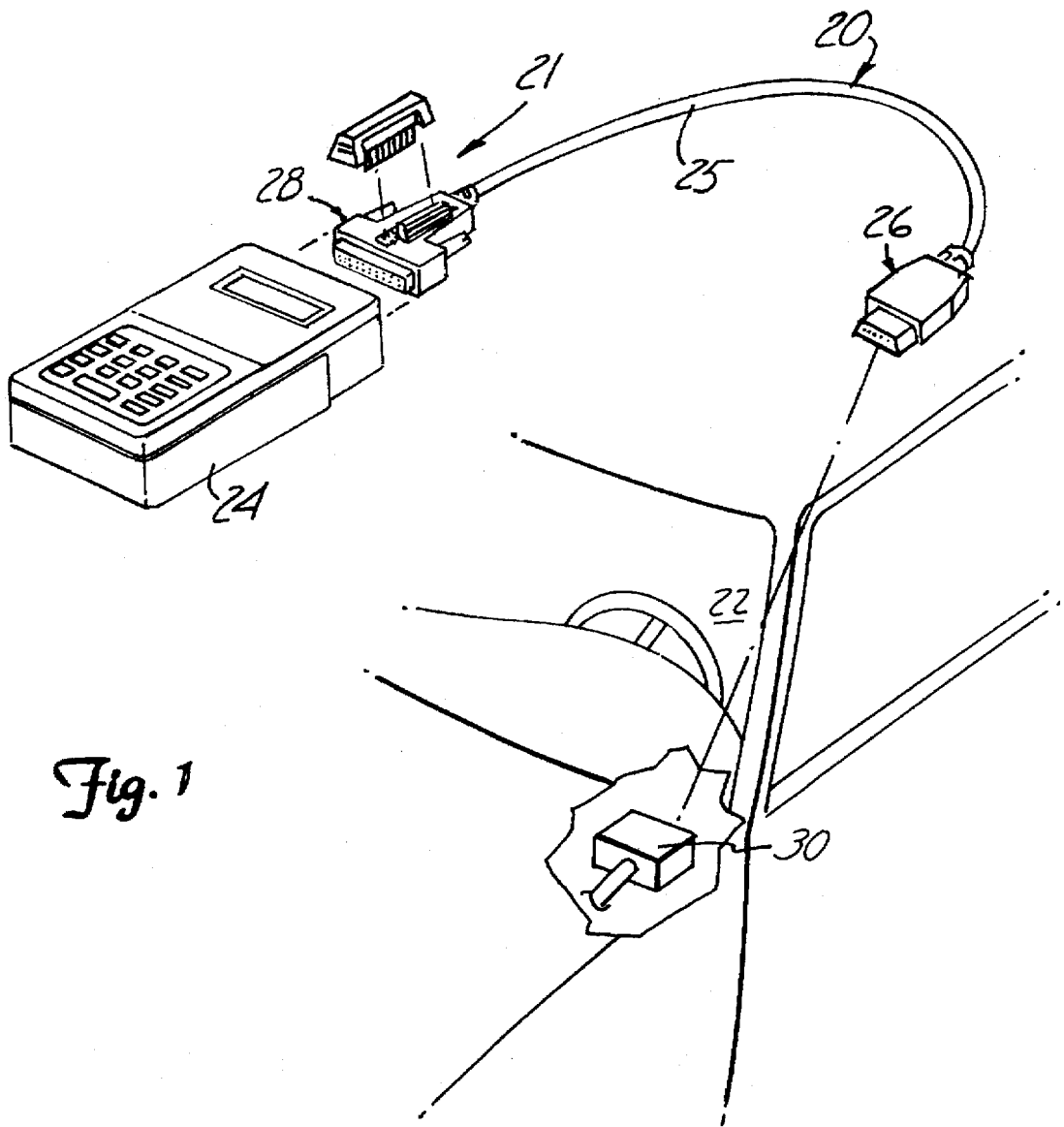
FIG. 1 illustrates a hand-held service tool connected to a vehicle through a connector assembly having a mechanical multiplexer of the present invention.

The present invention will be described in detail with particular reference to automobiles, but the invention can be used with any vehicle having an electronic control module for interfacing with a service tool, such as marine vehicles or earth working vehicles. FIG. 1 illustrates a connector assembly 20 for connection between an automobile 22 and a service tool 24. The connector assembly 20 includes a mechanical multiplexer 21 in accordance with the present invention, and a multiconductor cable 25 that extends between a vehicle-side connector 26 and a tool-side connector 28. The vehicle-side connector 26 is adapted for connection to an on-board diagnostic plug 30 (OBD II) within the automobile 22. Some automobiles manufactured today have, and all automobiles manufactured after 1996 must have, an OBD II plug to allow easy access to one or more on-board electronic control modules (ECMs).

Figure 2:
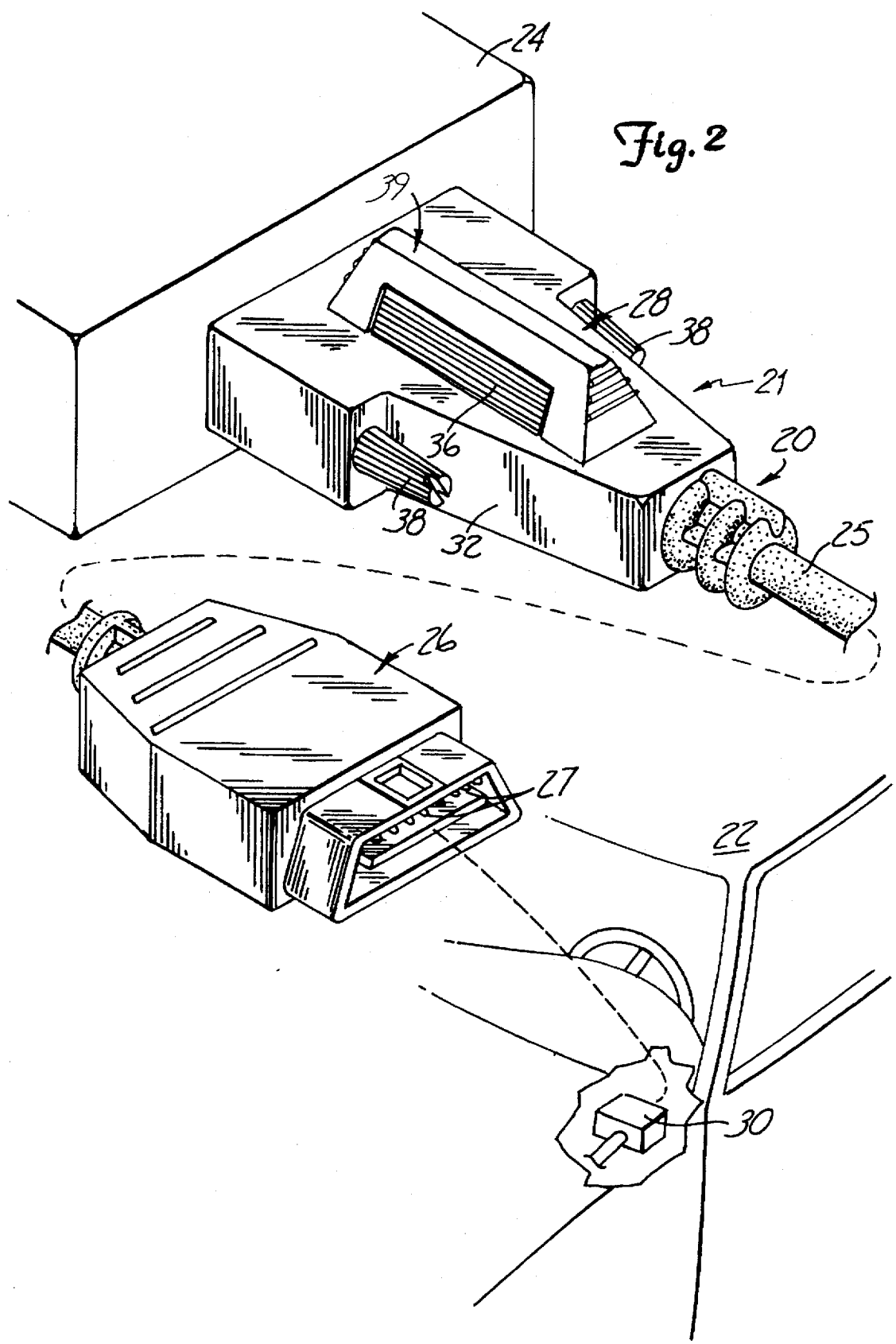
FIG. 2 is a close-up view of the connector assembly and mechanical multiplexer of FIG. 1.

FIG. 2 is a close-up view of the connector assembly 20 attached to the service tool 24. As shown in greater detail in FIG. 2, the tool side connector 28 comprises a housing 32, a guide member 36, screws 38, and a removable coupling module 39, which will be described in greater detail below. In the first preferred embodiment, the housing 32 is formed of molded plastic, such as textured PVC (70–85), but any rigid non-conductive housing material would suffice. The guide member 36 mates with the removable coupling module 39 when the coupling module 39 is inserted into the housing 32. The screws 38 positively lock the tool-side connector 28 to the service tool 24 to ensure that continuous electrical contact is made between the service tool 24 and the tool-side connector 28.

The vehicle-side connector 26 that connects to the OBD II plug 30 is also shown in greater detail in FIG. 2. The vehicle-side connector 26 has a "D" shaped connector having sixteen male blade terminals 27 for insertion into the OBD II plug 30.

FIG. 3 is a perspective view of the tool-side connector 28 shown in FIGS. 1 and 2 with the coupling module 39 removed. The tool-side connector 28 further comprises a receptacle 34 that extends into the housing 32 and which receives the coupling module 39. In the preferred embodiment, the receptacle 34 is a standard, dual edge card connector. The receptacle 34 has a first set of receptacle contacts 43 which are arranged in a first row 42 and a second set of receptacle contacts 45 which are arranged in a second row 44. The first row of receptacle contacts 42 is adjacent to and oppositely faces the second row of receptacle contacts 44. Each set of receptacle contacts 43 and 45 can include a plurality of individual contacts.

FIG. 4 is a perspective view of the tool-side connector 28 of FIG. 3, as seen from the opposite side. The tool-side connector 28 has a pin connector 40 mounted into the housing 32. The screws 38 extend through the housing 32 adjacent the pin connector 40. The pin connector 40 includes a plurality of right angle conductors 48 which terminate at an outermost edge of the pin connector 40 for electrical connection to the service tool 24 when the pin connector 40 is attached to the service tool 24. In the first preferred embodiment, pin connector 40 is an industry standard 25-pin DB25 connector. By providing twenty-five pins to the service tool 24, the service tool may be used on vehicles having more pins than the 16-pin vehicle-side connector 26. If, for example, an earth working vehicle having a 25-pin diagnostic link plug were to be serviced, the same service tool as that used on automobiles could be used on the earth working vehicle, but a new connector assembly would be needed having a 25-pin vehicle-side connector and the same industry standard 25-pin DB25 connector 40.

Figure 5A:
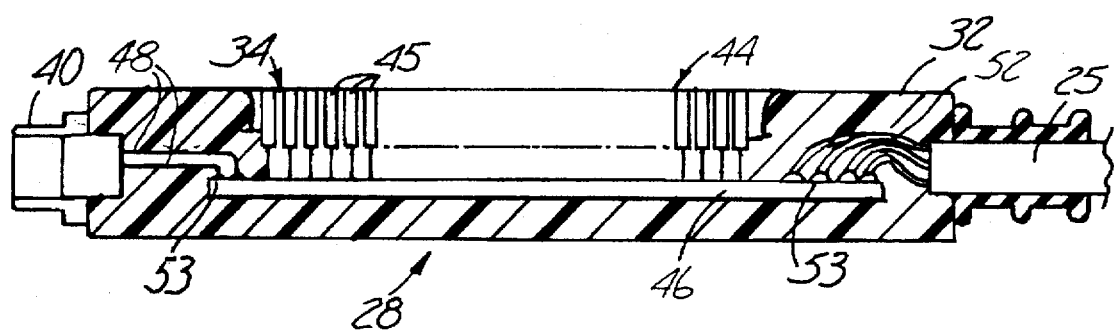
FIG. 5a is a longitudinal sectional view of the tool-side connector taken along line 5a—5a of FIG. 3.

FIG. 5a is a longitudinal sectional view of the tool-side connector 28 taken along line 5a—5a of FIG. 3. As can be seen in FIG. 5a, the housing 32 of the tool-side connector 28 supports the receptacle 34, the pin connector 40, and a circuit board 46. The tool-side connector has a solid body molded over the receptacle 34 and the connector 40 by a process known in the art as insert injection molding.

The multiconductor cable 25 includes a plurality of conductors 52 that extends between the vehicle-side connector 26 and the tool-side connector 28. The conductors 52 are electrically connected to the circuit board 46 and to the male blade terminals 27 (shown in FIG. 2). When the vehicle-side connector 26 is inserted into the OBD II plug 30, the conductors 52 electrically connect the circuit board 46 to individual terminals (not shown) of the OBD II plug 30.

The right angle conductors 48 and the conductors 52 are electrically connected to the circuit board 46 in a commonly known manner such as by soldering, as illustrated by solder bumps 53. The receptacle 34 is also connected directly to the circuit board 46 in a commonly known manner, such as by soldering.

Figure 5B:
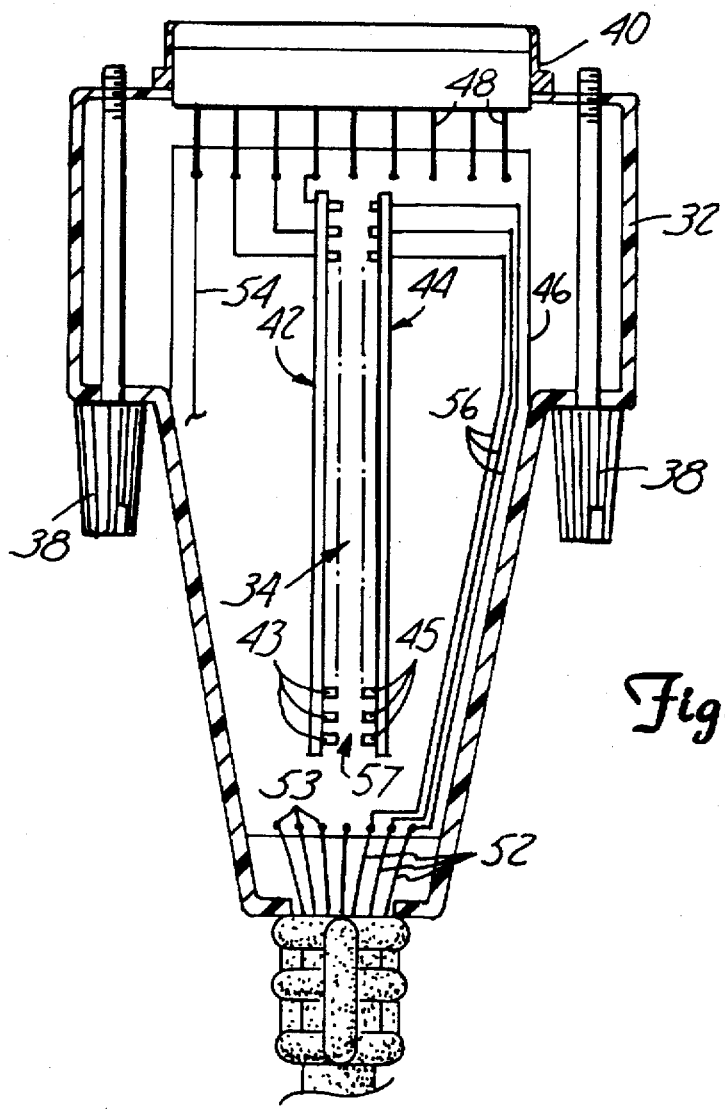
FIG. 5b is a sectional view of the tool-side connector taken along line 5b—5b of FIG. 3.

FIG. 5b is a sectional view of the tool-side connector 28 taken along line 5b—5b of FIG. 3. FIG. 5b illustrates an example of the potential electrical connection of the first and second rows of receptacle contacts 42 and 44 to the right angle conductors 48 and the conductors 52, respectively. For ease of reader understanding, the present invention, and Figures are being described an illustrated with all of the right angle conductors 48 being connected to the first row of receptacle contacts 42 and all of the conductors 52 being connected to the second row of receptacle contacts 44. This is done for readability and reader comprehension. In practice, things such as printed circuit board routing must be considered. Thus in practice, some of the conductors 52 may be connected to selected ones of the first set of contacts and some of conductors 52 may be connected to selected ones of the second set of contacts 45. The same holds true for right angle conductors 48.

With this in mind, the first row of receptacle contacts 42 is electrically connected to the right angle conductors 48 via a first set of routing leads 54 on the circuit board 46. The second row of receptacle contacts 44 is electrically connected to the conductors 52 via a second set of routing leads 56 on the circuit board 46. The circuit board 46 may be of a single layer, or multi-layer construction. If the circuit board 46 is a single layered board, the routing leads 54 and 56 will all be on the same layer, as illustrated in FIG. 5b. If the circuit board 46 is a multi-layered board, the routing leads can be routed on any one, or a plurality of layers. It should be noted that each of the conductors 48 and 52 could also be directly connected to the first and second rows of receptacle contacts 42 and 44 instead of routing the connections through circuit board 46, if desired.

As shown in FIG. 5b, the first and second rows of receptacle contacts 42 and 44 are positioned parallel and adjacent to one another such that the first set of receptacle contacts 43 oppositely faces the second set of receptacle contacts 45 and forms a slot 57 therebetween. The slot 57 is sized to receive the coupling module 39 when the coupling module is inserted into the receptacle 34.

Figure 6:
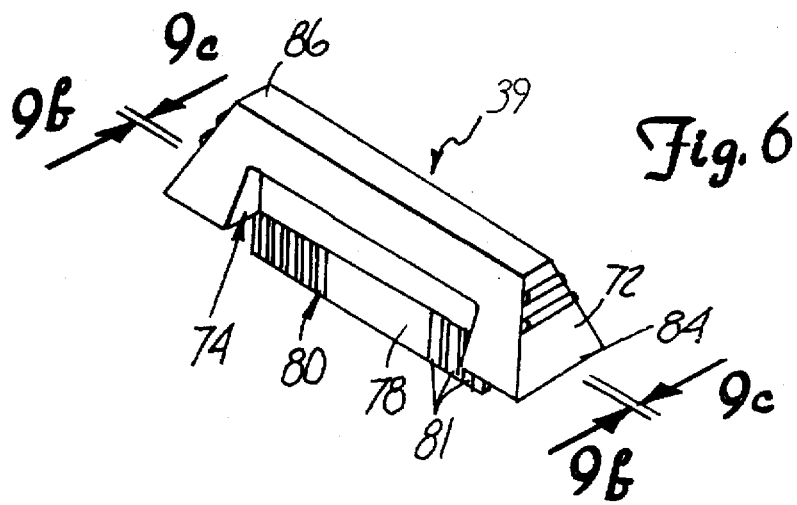
FIG. 6 is a perspective view of a coupling module, according to the present invention.

FIG. 6 is a perspective view of the coupling module 39. The coupling module 39 is insertable into the receptacle 34 of the tool-side connector 28. The coupling module 39 comprises a body 72, a guide member receiving slot 74 formed out of the body 72, and a printed circuit board 78. The circuit board 78 has a first set of module contacts 80 extending below the body 72 of the coupling module 39. The first set of module contacts 80 includes a plurality of individual contacts 81 which are arranged to mate with the first set of receptacle contacts 43 when the coupling module 39 is inserted into the receptacle 34 (as shown in FIG. 2).

FIG. 7 is a perspective view of the coupling module 39 of FIG. 6 as seen from the opposite side of the circuit board 78. The circuit board 78 further includes a second set of module contacts 82 extending below the body 72 of the coupling module 39. The second set of module contacts 82 includes a plurality of individual contacts 83 which are arranged to mate with the second set of receptacle contacts 45 when the coupling module is inserted into the receptacle 34 (as shown in FIG. 2).

As illustrated in FIGS. 6 and 7, the coupling module 39 preferably has a pyramidal cross section, with a wide base 84 which tapers to a narrow peak 86. The shape of the body 72 serves both aesthetic and functional purposes. Aesthetically, the shape of the body 72 gives the coupling module 39 a pleasing look. Functionally, the wide base 84 of body 72 gives the coupling module 39 added stability when inserted into the receptacle 34. Without the wide base 84, it would be possible to snap off the circuit board 78 while the module 39 is inserted into the receptacle 34. Also, the wide base 84 gives the service technician something to grip when inserting or removing the module 39.

FIG. 8 is a bottom view of the coupling module of FIGS. 6 and 7. As can be seen in FIG. 8, the first set of module contacts 80 is adjacent to the guide member receiving slot 74. In the preferred embodiment, there is a corresponding contact 83 in the second set of module contacts 82 for each contact 81 in the first set of module contacts 80.

Figure 9A:
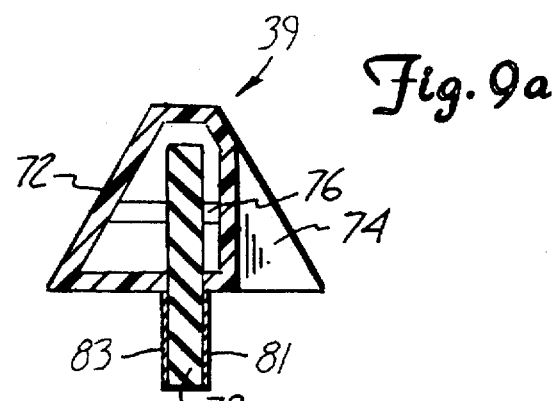
FIG. 9a is a sectional view taken along line 9a—9a of FIG. 7.

FIG. 9a is a sectional view of the coupling module 39 taken along line 9a—9a of FIG. 7. As can be seen in FIG. 9a, the coupling module 39 is hollow and is formed from two halves 73 and 75 that are secured together in a known manner such as with glue. A pair of mounting posts 76 are provided to retain the circuit board 78 in place when the module halves 73 and 75 are glued together such that the board 78 protrudes below the base 84 of the body 72 by approximately ¼ inch. The body 72 of the module 39 is preferably non-conductive to prevent the module contacts 81 and 83 from shorting. In the preferred embodiment, the body 72 of the coupling module 39 is made of a molded plastic similar to the housing 32 of the tool-side connector 28.

Figure 9B:
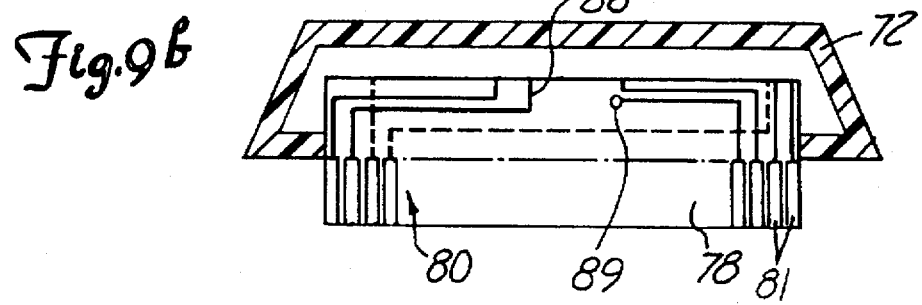
FIG. 9b is a sectional view taken along line 9b—9b of FIG. 6.
Figure 9C:
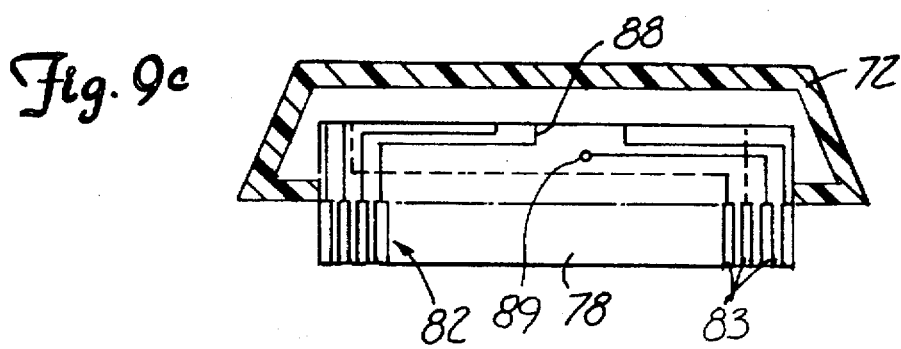
FIG. 9c is a sectional view taken along line 9c—9c of FIG. 6.

FIGS. 9b and 9c are sectional views of both sides of the circuit board 78 of coupling module 39. As with FIG. 5b, FIGS. 9b and 9c are being illustrated in a manner to enhance reader understanding. Thus, the circuit board 78 includes routing leads 88 which electrically connect the first set of module contacts 80 to the second set of module contacts 82 in a selected connection pattern. The routing leads 88 can be configured to electrically connect any one of the contacts 81 in the first set of the module contacts 80 to any one or a plurality of the contacts 83 in the second set of the module contacts 82. In practice, some of the contacts 81 in the first set of module contacts 82 may be connected to other contacts 81 in the first set of module contacts 80. The same holds true for the second set of contacts 82.

The routing leads 88 are routed from one side of the board to the other in a commonly known manner, such as through vias 89 or over the top of the circuit board 78. As with the circuit board 46, the circuit board 78 may be a single layered board or a multi-layered board. In the preferred embodiment, a multi-layered board is used. The routing leads 88 shown in phantom in FIGS. 9b and 9c are routed on different layers than those leads shown in solid. Routing leads on different layers avoids shorting leads when the leads cross paths.

FIG. 10 is an exploded perspective view of the tool-side connector 28 and the coupling module 39. The guide member receiving slot 74 is sized to receive the guide member 36 of the tool-side connector housing 32 when the coupling module 39 is inserted into the receptacle 34. The guide member 36 and the guide member receiving slot 74 work together as a key or safety feature to prevent a service technician from inserting the coupling module 39 into the receptacle 34 backwards, thus making unwanted, and potentially damaging electrical connections.

The configuration of the routing leads 88 dictates which of the contacts 43 in the first set of receptacle contacts 42 are electrically coupled to which of the contacts 45 in the second set of receptacle contacts 44. The first and second sets of receptacle contacts 42 and 44 are electrically isolated from one another so that no connection is made between individual contacts 43 and 45 until the coupling module 39 is inserted into the receptacle 34.

When the tool-side connector 28 (with the coupling module 39 inserted) is connected to the service tool 24 and the vehicle-side connector 26 is connected to the OBD II plug 30, an electrical path is made between individual terminals (not shown) of the service tool 24 and individual terminals (not shown) of the OBD II plug 30. The electrical path is made from the service tool 24 to the right angle conductors 48 (FIG. 4), to the routing leads 54 (FIG. 5b), to the first set of receptacle contacts 43 (FIG. 5b), to the first set of module contacts 80 (FIG. 9b), to the routing leads 88 (FIG. 9b), to the second set of module contacts 82 (FIG. 9c), to the second set of receptacle contacts 45 (FIG. 5b), to the routing leads 56 (FIG. 5b), to the conductors 52 (FIG. 5b), to the male blade terminals 27 (FIG. 2), and finally to the OBD II plug 30.

Depending upon the configuration of the coupling module 39 and the placement of the routing leads 88 of the coupling module 39, selected service tool terminals will be connected to selected OBD II terminals.

By altering the configuration of the coupling module 39, different pin configurations of the OBD II plug 30 can be accommodated by the same connector assembly 20. A service technician can simply interchange one coupling module 39 for another to service an automobile having a different OBD II plug configuration. Therefore, the service technician need only have one connector assembly 20 and a set of vehicle-specific coupling modules 39 to accommodate a variety of different OBD II plug configurations.

FIG. 11 illustrates an alternative embodiment of the present invention. In FIG. 11, elements similar to those shown in the previous figures are labeled with the same reference numerals. The embodiment shown in FIG. 11 is the same as the embodiment shown in FIGS. 1–10, except that coupling module 39' further includes a power lead 90 for providing power to the service tool 24. The SAE requires that power be provided by the OBD II plug 30 to power any type of diagnostic or service tool, but not all of the manufacturers of automobiles may adhere to this requirement. Thus, in order to provide power to the service tool 24 when servicing some automobiles, a separate power connection, such as the power lead 90, is required.

The power lead 90 includes both a power line and a reference or ground line which can be connected to the automobile 22 in any known manner. For example, the power lead 90 may include an adapter to plug into the automobile's cigarette lighter, or it may be provided with clips to directly connect to the automobile's battery terminals. The power and reference lines extend within the body 72 of the coupling module 39' and are electrically connected to selected routing leads 88 (shown in FIGS. 9b and 9c) on the circuit board 78 in a commonly known manner. When the coupling module 39' is inserted into the receptacle 34, the power line and the reference line from power lead 90 are then provided to selected contacts in the first set of receptacle contacts 42. The contacts that are coupled to the power line and the reference line are then coupled to the pin connector 40 via the routing leads 54 (FIG. 5b) and then ultimately to the service tool 24.

The present invention has both a time saving and a cost saving advantage over the adapters described in the prior art. A service technician may easily and quickly replace the coupling modules 39 of the present invention without having to disconnect the connector assembly 20 from either the service tool 24 or the automobile 22. Not only do the coupling modules of the present invention cost less than the previously known adapters, a service technician is much less likely to leave a coupling module in the automobile, since the coupling module does not connect directly to the automobile as do the known adapters.

The shape of the coupling module 39 is not a critical feature of the present invention. The module can easily be modified to be of a rectangular design or spherical on top without departing from the spirit of the invention. Similarly, the size and shape of the guide member 36 is not critical. Also, the arrangement and orientation of the receptacle and the module contacts is not important. For example, a circular array of contacts, such as a plug used for connecting computer terminals may be used with an appropriate receptacle, or a standard DB25 connector and receptacle could be used without departing from the spirit and scope of the invention. However, in the preferred embodiment, the dual edge card connecter and the corresponding insertable printed circuit board are used because of their low cost, and ease of manufacturing.

The coupling module can also be made of active elements instead of the passive elements used in the preferred embodiment without departing from the spirit or scope of the invention. Active switching elements can be used to make the desired connections of conductors without departing from the spirit or scope of the invention. Also, signal conditioning components may be included on the coupling module to condition the signals from the vehicle under test to the service tool. The power line provided in the alternative embodiment may be used to provide power for the above mentioned active elements and signal conditioning components.

It is also important to note that the positioning of the receptacle in the tool-side connector is not critical. The receptacle can be formed in the top, bottom or sides of the connector. In addition, the mechanical multiplexer receptacle can be implemented on the vehicle-side connector instead of on the tool-side connector without departing from the spirit of the invention. Also, the receptacle can be formed within the service tool without departing from the spirit of the invention.

Although the present invention has been described with reference to preferred embodiments, workers skilled in the art will recognize that other changes may be made in form and detail without departing from the spirit and scope of the invention.

What is claimed is:

1. A mechanical multiplexer comprising:
    a receptacle having first and second sets of receptacle contacts;
    an upstanding guide member adjacent the receptacle; and
    a removable coupling module including:
        a body defining a guide member receiving slot sized for receiving the guide member to guide insertion of the coupling module into the receptacle; and
        a first and second set of module contacts extending below the body and arranged to make electrical connection between the first and second set of receptacle contacts, when the coupling module is positioned within the receptacle, wherein the first set of module contacts is electrically connected to the second set of module contacts in a selected connection pattern.

2. The multiplexer of claim 1 wherein the guide member receiving slot extends into a side of the coupling module.

3. The multiplexer of claim 1 wherein the coupling module has a power lead for connection to a power source, the power lead being connected to at least one contact within the first or second sets of module contacts.

4. A mechanical multiplexer comprising:
    a housing having a first and a second end;
    a first set of conductors at the first end of the housing;
    a second set of conductors at the second end of the housing;
    a receptacle formed in the housing, the receptacle having a first and second set of receptacle contacts electrically connected to the first and second set of conductors in a selected order;
    a removable coupling module insertable into the receptacle for coupling at least one of the first set of conductors to at least one of the second set of conductors, wherein the coupling module includes first and second sets of module contacts comprised of individual contacts arranged to make electrical contact with the first and second sets of receptacle contacts, respectively, when the coupling module is positioned within the receptacle, wherein the individual contacts of the first set of module contacts are electrically connected to other contacts in the first set of module contacts or to the individual contacts of the second set of module contacts in a selected connection pattern and wherein the receptacle contacts are electrically isolated from one another when the coupling module is removed from the receptacle;
    an upstanding guide member projecting from one of the housing and coupling module adjacent the receptacle; and a guide member receiving slot formed within the other of the housing and the coupling module adjacent the receptacle, wherein the slot is sized for at least partially receiving the guide member to ensure proper insertion of the coupling module into the receptacle.

5. The multiplexer of claim 4 wherein the guide member comprises an elongate projection extending from the housing adjacent the receptacle and wherein said guide member slot is formed within the coupling module.

6. The multiplexer of claim 5 wherein the coupling module includes:

a body having a base for engaging the housing adjacent to and above the receptacle.

7. The multiplexer of claim 6 wherein the guide member receiving slot extends into a side of the body.

8. The multiplexer of claim 6 including a pair of converging gripping surfaces extending from the base.

9. The multiplexer of claim 4 wherein the coupling module has a body and a circuit board attached thereto and extending below the body, with the first and second sets of module contacts being positioned on the circuit board and wherein the circuit board is insertable into the receptacle and has a plurality of routing leads which electrically connect the individual contacts of the first and second sets of module contacts in the selected connection pattern.

10. The multiplexer of claim 9 wherein the coupling module has a power lead for connection to a power source, the power lead being connected to at least one contact within the first or second sets of module contacts.

11. The multiplexer of claim 4 wherein:

the first set of receptacle contacts is arranged in a first row and the second set of receptacle contacts is arranged in a second row which is adjacent to and oppositely faces the first row to form a slot between the first row and the second row; and the coupling module includes a circuit board with first and second oppositely facing surfaces, with the first set of module contacts being positioned on the first surface and arranged to mate with the first set of receptacle contacts and with the second set of module contacts being positioned on the second surface and arranged to mate with the second set of receptacle contacts when the coupling module is inserted into the receptacle.

12. A coupling module for insertion into a vehicle diagnostic connector assembly having a tool-side connector, a vehicle-side connector and a multiconductor cable extending between and electrically connecting the tool-side connector and the vehicle-side connector, wherein the tool-side connector has a receptacle with a first row of receptacle contacts and a second row of receptacle contacts which is parallel to the first row of receptacle contacts to form a slot therebetween for receiving the coupling module, the coupling module comprising:

a body including a base having a width greater than a width of the slot, wherein the base is adapted to engage the tool-side connector above the slot; and a circuit board attached to the body and having first and second oppositely facing surfaces which extend below the body for insertion into the slot, wherein the first surface has a first set of module contacts arranged to mate with the first set of receptacle contacts and wherein the second surface has a second set of module contacts arranged to mate with the second set of receptacle contacts wherein the first and second set of module contacts comprise individual contacts, the circuit board having a plurality of routing leads connecting the individual contacts of the first set of module contacts to other contacts in the first set of module contacts or to the individual contacts of the second set of module contacts in a selected connection pattern.

13. The coupling module of claim 12 including:

an upstanding guide member projecting from one of the tool-side connector and the body of the coupling module adjacent the receptacle; and a corresponding guide member receiving slot extending into the other of the tool-side connector and the body of the coupling module adjacent the receptacle, wherein the guide member receiving slot mates with the guide member to guide insertion of the circuit board into the receptacle.

14. A mechanical multiplexer comprising:

a connector having a housing defining a receptacle extending into the housing, the receptacle including a plurality of receptacle contacts; and a removable coupling module including:

a circuit board sized for insertion into the receptacle having a plurality of module contacts positioned to make electrical connection between selected ones of the plurality of receptacle contacts when the circuit board is positioned within the receptacle; and a body extending above the circuit board, the body including a base surface for engaging the housing above the receptacle;

an upstanding guide member projecting from one of the housing and the body; and a guide member receiving slot extending into the other of the housing and the body, wherein the guide member receiving slot is sized for mating with the guide member so as to guide insertion of the circuit board into the receptacle.

15. The multiplexer of claim 14 wherein the body includes:

side gripping surfaces extending from the base surface.

16. The multiplexer of claim 15 wherein the upstanding guide member projects from the housing and wherein the guide member receiving slot extends into the body.

* * * * *

UNITED STATES PATENT AND TRADEMARK OFFICE
CERTIFICATE OF CORRECTION

PATENT NO. : 5,683,261
DATED : NOVEMBER 4, 1997
INVENTOR(S) : JEROME C. AHLES, JOHN D. NEAL, RANDEE L. KYROLA

It is certified that error appears in the above-identified patent and that said Letters Patent is hereby corrected as shown below:

> Title page, item [57],
> In the ABSTRACT, line 8, delete "eider", insert --either--

Signed and Sealed this

Twentieth Day of October, 1998

Attest:

BRUCE LEHMAN

Attesting Officer

Commissioner of Patents and Trademarks